United States Patent [19]

Norrell et al.

[11] Patent Number: 6,034,993
[45] Date of Patent: Mar. 7, 2000

[54] METHOD AND APPARATUS FOR ADAPTIVELY EQUALIZING A SIGNAL RECEIVED FROM A REMOTE TRANSMITTER

[75] Inventors: Andrew L. Norrell, Nevada City, Calif.; Dale M. Walsh, Golf, Ill.

[73] Assignee: 3Com Corporation, Santa Clara, Calif.

[21] Appl. No.: 08/970,836

[22] Filed: Nov. 14, 1997

Related U.S. Application Data

[60] Provisional application No. 60/031,072, Nov. 15, 1996.

[51] Int. Cl.[7] ................................... H03H 7/30
[52] U.S. Cl. ................ 375/232; 375/222; 375/231; 375/233
[58] Field of Search ................... 375/222, 230, 375/231, 232, 233, 243, 247, 248, 249, 346; 332/100; 360/45

[56] References Cited

U.S. PATENT DOCUMENTS

| | | | |
|---|---|---|---|
| 5,233,635 | 8/1993 | Henriksson et al. | 375/346 |
| 5,343,335 | 8/1994 | Hara | 360/45 |
| 5,386,202 | 1/1995 | Cochran et al. | 332/100 |
| 5,539,774 | 7/1996 | Nobakht et al. | 375/232 |

OTHER PUBLICATIONS

Kohonen et al., "Combining Linear Equalization and Self-Organizing Adaptation in Dynamic Discrete–Signal Detection", International Joint Conference on Neural Networks (IJCNN), vol. I, 17, Jun. 1990, San Diego, pp. 223–228.

*Primary Examiner*—Stephen Chin
*Assistant Examiner*—Chieh M. Fan
*Attorney, Agent, or Firm*—McDonnell Boehnen Hulbert & Berghoff

[57] ABSTRACT

An apparatus and method for adaptively equalizing a signal received from a remote transmitter. The equalizer includes a filter having an output and a decision circuit coupled to the filter output. In addition, the equalizer has a reference coupled to the decision circuit. The reference includes a model of a non-linear characteristic of a remote transmitter. The method relates to adaptively equalizing a signal received from a remote transmitter. The method includes the step of receiving a signal corresponding to a predetermined reference level from the remote transmitter. Next, the received signal level is filtered to remove linear error terms. The next step of the method includes measuring a non-linear error term associated with the received and filtered signal. The measured non-linear error term may then be stored and used to make improved decisions on data signals transmitted from the remote transmitter.

24 Claims, 4 Drawing Sheets

METHOD AND APPARATUS FOR ADAPTIVELY EQUALIZING A SIGNAL RECEIVED FROM A REMOTE TRANSMITTER

CROSS-REFERENCE TO RELATED APPLICATIONS

This application claims the benefit under 35 U.S.C. § 119(e) of U.S. Provisional Application No. 60/031,072, filed Nov. 15, 1996, which is entitled A Method and Apparatus for Adaptively Equalizing A Signal Received From a Remote Transmitter.

BACKGROUND OF THE INVENTION

The present invention relates to data communication receivers and, more particularly, to receivers that convert an incoming analog signal into digital data. Data communication receivers of this type are frequently used in telephone networks, which include hardware for the transmission of voiceband signals.

A growing number of businesses, industries and home computer users have come to rely on the ability to quickly move data from one point to another. Many of these users view the speed of the data transmission as critical to use of the transmission medium for communication. In addition, they have come to expect quality and reliability in the data transmission.

Most of this data traffic currently is carried over voiceband telephone networks. These telephone networks typically can carry signals that range in frequency from approximately 300 Hz to 3400 Hz, which, not coincidentally, roughly corresponds to the range of the human voice spectrum. Signals outside this range are sharply attenuated by the networks. This constraint on frequency range, or bandwidth, constrains the maximum attainable data rate.

Figure 1:
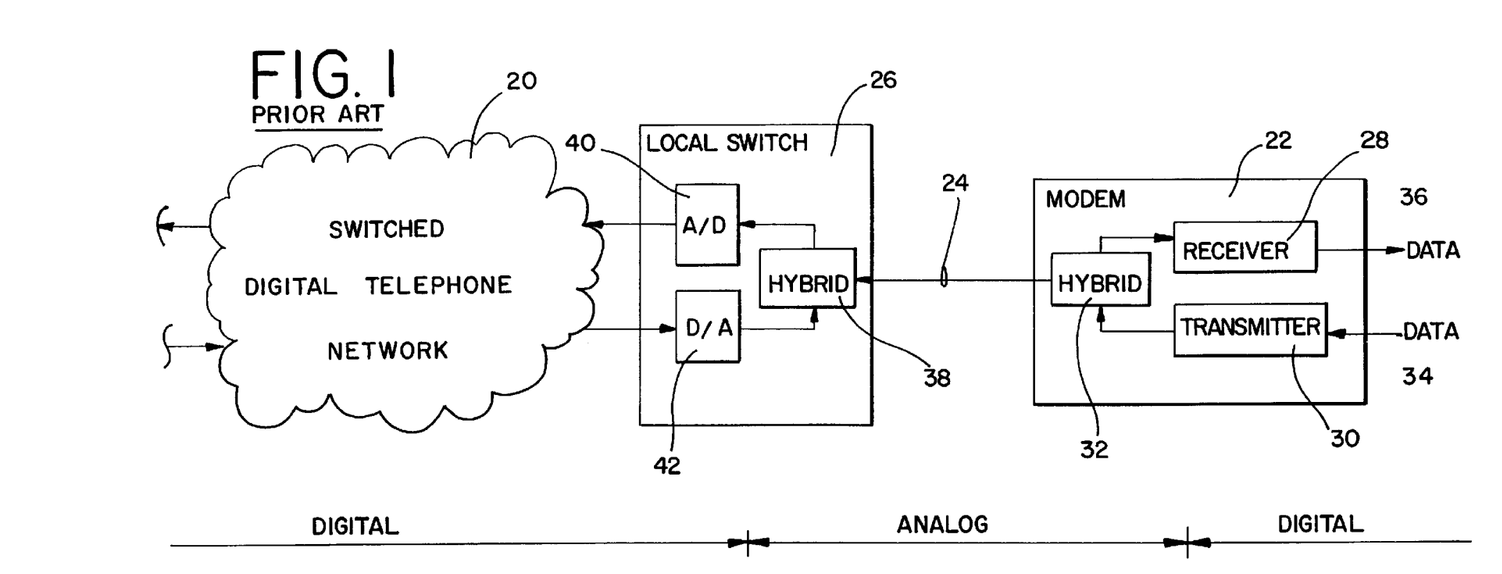
FIG. 1 is a functional representation of a subscriber loop connection for the transmission of data to and from a switched digital telephone network.

Although the bulk of the long-distance and inter-office traffic on the telephone networks is carried digitally, many subscribers to the telephone networks are connected to the digital infrastructure by a two-wire analog line that is commonly referred to as a subscriber "loop." FIG. 1 shows a typical subscriber loop connection for the transmission of data to and from the switched digital telephone network 20. The basic elements of this subscriber loop connection are a modem 22 that is connected by a two-wire analog line 24 to a local switch 26, which terminates the switched digital telephone network 20.

The modem 22 is typically located at the subscriber's premises and includes a receiver 28 and a transmitter 30. As shown in FIG. 1, the receiver 28 and the transmitter 30 are coupled to the analog line 24 by a hybrid 32. The transmitter 30 converts input digital data 34 into analog signals that are passed through the hybrid 32 and transmitted over the analog line 24 to the local switch 26. Likewise, the receiver 28 converts input analog signals, which pass from the analog line 24 through the hybrid 32, into digital data 36.

At the local switch 26 end of the subscriber loop, analog signals from the line 24 are directed through a hybrid 38 to an analog-to-digital converter 40. The analog-to-digital converter 40 samples the analog signals converting them into a digital data stream for transmission through the switched digital telephone network 20. For transmission in the opposite direction, a digital data stream is applied from the digital telephone network 20 to a digital-to-analog converter 42. The digital-to-analog converter 42 converts the data stream into analog signals that are passed through the hybrid 38 to the analog line 24, for transmission to the appropriate subscriber.

Various standards have been adopted throughout the world for the analog-to-digital and digital-to-analog conversions. The United States, for example, uses a conversion scheme in which the analog-to-digital converter in the local switch samples the analog signals at the rate of 8000 samples per second and maps the samples into one of 255 possible distinct codewords. The 255 codewords correspond to quantization levels defined by a non-linear mapping rule called the $\mu$-law companding rule, which is the Pulse Code Modulation ("PCM") voice coding and companding standard in North America and Japan. The codeword chosen for each sample corresponds to the quantization level that is closest to the voltage of the analog sample. The digital-to-analog converter in the local switch performs the inverse of this mapping, converting codewords into analog voltage signals.

Figure 2:
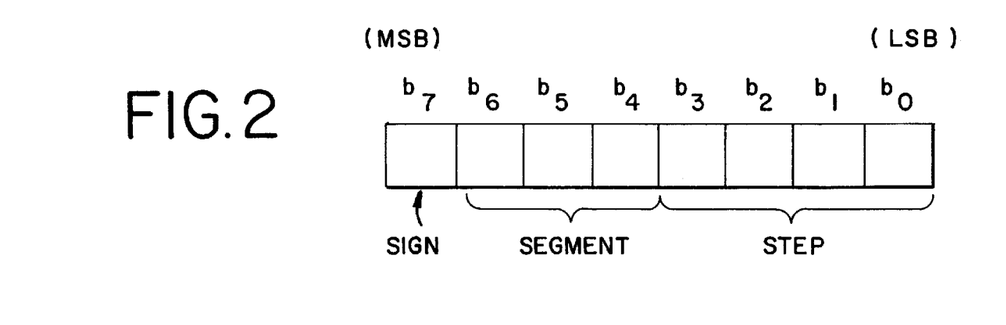
FIG. 2 shows a bit allocation map for a μ-law codeword used within the switched digital telephone network shown in FIG. 1.

The codewords utilized by the switched digital telephone network are typically eight bit codewords. FIG. 2 shows a bit allocation map for a $\mu$-law codeword. In the eight bit codeword, the most significant bit, $b_7$, is a sign bit. The next three bits, $b_6$ through $b_4$, identify one of eight segments in the claw quantization characteristic. The last four bits, $b_3$ through $b_0$, identify one of sixteen steps within that segment.

At the modem end of the subscriber loop, it is the function of the modem receiver to recover digital data from the received analog signal. Modem receivers, such as the receiver 28 in FIG. 1, typically include an adaptive equalizer, which is a digital signal processing device that dynamically adjusts the response of a modem's receiver. An adaptive equalizer may compensate for deleterious effects of the subscriber loops, which effects vary from connection to connection, as well as with time.

Devices are known that include adaptive equalizers. For example, U.S. Pat. No. 5,528,625 issued to Ayanoglu et al. shows a high speed modem with an equalization arrangement. The receiver component of the modem includes an analog-to-digital converter having an output that is coupled to six parallel receiver equalizers. Each of the receiver equalizers produces a sample stream that is operated on by a corresponding slicer to produce six slicer output symbol streams. A decoder maps the symbol streams into a data output stream. Training of the receiver equalizers is aided by an adaptation service unit within the digital telephone network. The adaptation service unit causes a known training sequence to be transmitted to the receiver. Appropriate coefficient settings for the six parallel receiver equalizers are then determined from the difference between their outputs and the known training sequence.

A disadvantage of the Ayanoglu device is its use of an adaptation service unit within the digital telephone network. It is desirable to avoid the addition of such structures to the digital telephone network infrastructure.

A further disadvantage of the Ayanoglu device is its use of six parallel receiver equalizers. It is desirable to minimize receiver complexity.

Accordingly, it would be desirable to have an improved method and apparatus for adaptively equalizing a signal received from a remote transmitter.

SUMMARY OF THE INVENTION

In accordance with a first aspect of the present invention, an equalizer is provided. The equalizer includes a filter having an output and a decision circuit coupled to the filter output. In addition, the equalizer has a reference coupled to the decision circuit. The reference includes a model of a non-linear characteristic of a remote transmitter.

In accordance with a second aspect of the present invention, a method of adaptively equalizing a signal received from a remote transmitter is provided. The method includes the step of receiving a signal corresponding to a predetermined reference level from the remote encoder. Next, the received signal level is filtered to remove linear error terms. The next step of the method includes measuring a non-linear error term associated with the received and filtered signal.

It is an object of the invention to provide an equalizer that compensates for non-linear inaccuracies in a remote transmitter.

It is a further object of the invention to provide an equalizer that adapts to inaccuracies of the remote transmitter.

DETAILED DESCRIPTION OF THE PRESENTLY PREFERRED EMBODIMENTS

Figure 3:
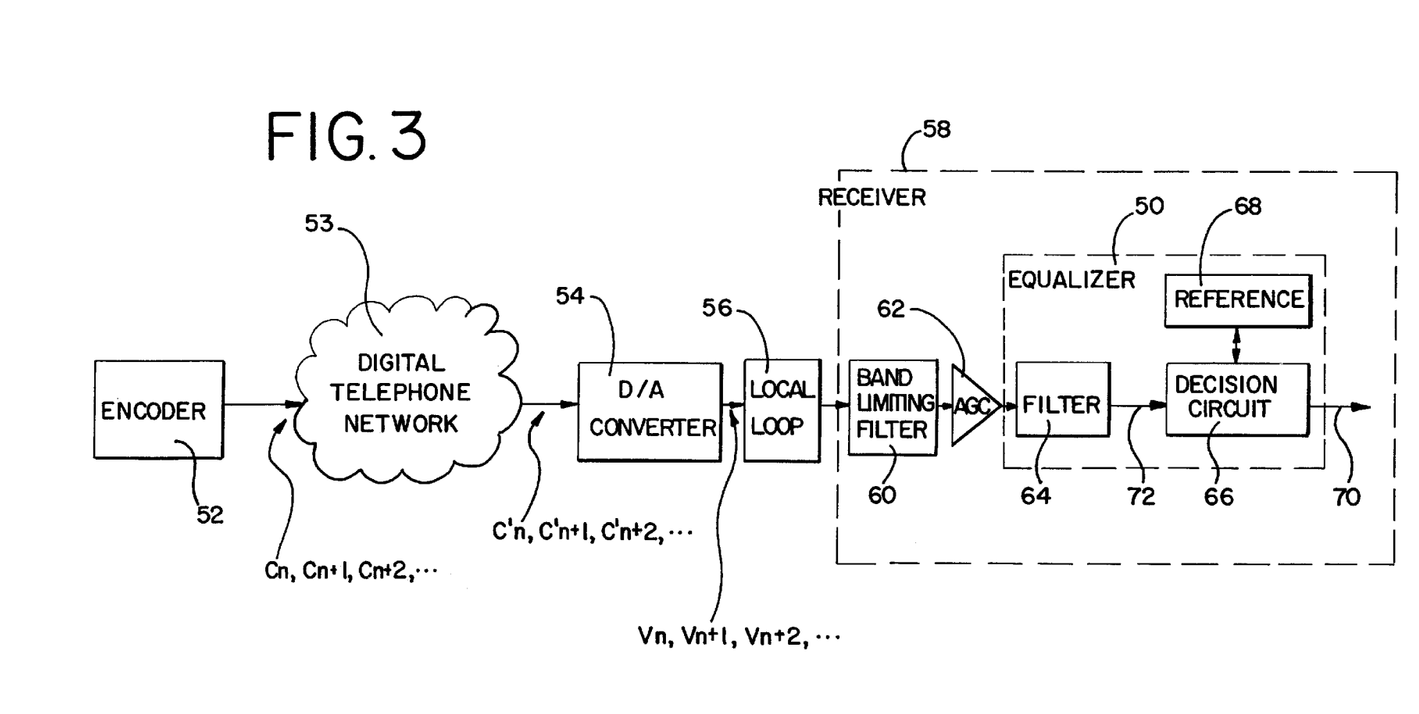
FIG. 3 is a functional block diagram of a data communication system having an adaptive equalizer in accordance with an embodiment of the present invention.

The presently preferred embodiments of the invention will now be described with reference to FIGS. 3 through 5, wherein like elements are referred to by like numerals. FIG. 3 is a functional block diagram of a data communication system having an adaptive equalizer 50 in accordance with an embodiment of the present invention.

As shown in FIG. 3, an encoder 52 is coupled to a digital-to-analog converter 54 through a switched digital telephone network 53. The encoder 52 is a remote digital transmitter that encodes incoming data into codewords for transmission over the switched digital telephone network 53. Typically, the digital-to-analog converter 54 is located at a local switch terminus of the switched digital telephone network, such as the local switch 26 shown in FIG. 1. An output of the digital-to-analog converter 54 is coupled to a local loop 56, such as a two-wire analog subscriber loop. A receiver 58 is coupled to receive signals from the local loop 56.

The receiver 58 includes a band limiting filter 60 that is coupled to an automatic gain control circuit 62. An output of the automatic gain control circuit 62 is coupled to the adaptive equalizer 50. The automatic gain control circuit 62 may alternatively precede the band limiting filter 60 in the receiver 58.

Referring to FIG. 3, the adaptive equalizer 50 includes a filter 64 that is coupled to a decision circuit 66. The decision circuit 66 is also coupled to a reference 68. The filter 64 is preferably an adjustable correlation filter that may be updated in accordance with an error signal developed by the decision circuit 66. The decision circuit 66 decides what the output signal 70 will be based upon an input signal 72 from the filter 64 and predetermined criteria supplied by the reference 68. Preferably, the reference 68 is also adaptive, as is described in greater detail below.

In operation, the data communication system shown in FIG. 3 transfers data from the encoder 52 to the receiver 58. The encoder 52 connects to the switched digital telephone network 53 and applies a sequence of codewords that are chosen from a set of codewords utilized by the switched digital telephone network 53. The codewords in the sequence of codewords applied by the encoder 52 may be referred to herein as $c_n$, $c_{n+1}$, $c_{n+2}$, ..., respectively. The sequence of codewords, $c_n$, $c_{n+1}$, $c_{n+2}$, ..., are transmitted through the switched digital telephone network 53 to the digital-to-analog converter 54. The codewords are typically transmitted from the encoder 52 to the switched digital telephone network 53 at the telephone network rate of 8000 codewords per second.

The switched digital telephone network 53 typically includes structures and processes, such as digital pads and robbed bit signalling, that may alter certain codewords in a well known manner. Thus, an altered sequence of codewords, $c'_n$, $c'_{n+1}$, $c'_{n+2}$, ..., may arrive at the digital-to-analog converter 54. Nonetheless, the original sequence of codewords, $c_n$, $c_{n+1}$, $c_{n+2}$, ..., may be obtained from the altered sequence of codewords, $c'_n$, $c'_{n+1}$, $c'_{n+2}$, ..., once the characteristics of the digital telephone network 53 are determined. Various techniques may be used to determine the characteristics of the digital telephone network 53. One method uses a training sequence of codewords to identify the network impairments. Once the impairments are detected, a subset of codewords that are transmitted over the digital telephone network 53 without ambiguity may be selected for use by the encoder 52. Further details of this method of detecting network impairments are provided in U.S. patent application Ser. No. 08/944,462, which is entitled Method of Detecting Network Impairments for High Speed Data Communication Over Conventional Subscriber Lines, the contents of which are incorporated herein by reference.

At the digital-to-analog converter 54, the sequence of codewords is converted into a sequence of analog voltages, $v_n$, $v_{n+1}$, $v_{n+2}$, ..., where each codeword in the set of codewords is converted to a voltage level. The set of codewords utilized by the digital telephone network and the corresponding analog voltages are determined by the quantizing characteristic of the digital-to-analog converter 54. The digital-to-analog converter 54 may, for example, have the quantizing characteristic of a claw compander, in which case there are 255 possible codewords in the set, having the form shown in FIG. 2, each of the 255 codewords being associated with a unique voltage level. Alternatively, the digital-to-analog converter 54 may have the characteristic of an A-law compander, linear quantizer or such other characteristic as may be desirable for a particular application. The digital-to-analog converter 54 may be referred to herein as a telephone network codec, although it is recognized that the telephone network codec, as commonly understood, would also include for example the analog-to-digital converter 40, shown in FIG. 1.

The analog voltages, $v_n$, $v_{n+1}$, $v_{n+2}$, ..., are transmitted over the local loop 56 to the receiver 58. Generally, the receiver 58 then reverses the digital-to-analog conversion process and recovers the particular sequence of codewords, $c'_n$, $c'_{n+1}$, $c'_{n+2}$, ..., that produced the analog voltages $v_n$, $v_{n+1}$, $v_{n+2}$, ... The preferred embodiments of the present invention relate to a method and apparatus for recovering an input to a remote transmitter, such as the sequence of codewords, $c'_n$, $c'_{n+1}$, $c'_{n+2}$, ..., that are input to the digital-to-analog converter 54, even in the situation where the conversion characteristic of the remote transmitter varies from the ideal.

It is to be understood that the codewords in the sequence of codewords may be related to data that is to be transmitted to the receiver 58 by an encoding process, such as scrambling and differential encoding. Any desirable encoding process may be used, depending upon the application. Where such an encoding process is used, the receiver is capable of extracting the encoder input data from the recovered sequence of codewords by inverting the encoding process.

Typically, the analog voltages arriving at the receiver 58 differ from the analog voltages, $v_n, v_{n+1}, v_{n+2}, \ldots$, that are generated by the digital-to-analog converter 54. After being converted to analog form, the combined effects of filtering in the telephone network equipment, the transfer characteristic of the local loop 56, and filtering in the receiver 58 (such as the band limiting filter 60) introduce linear distortion into the analog signals. Linear distortion results in a smearing or defocusing of the analog signals, such that the analog voltages, $v_n, v_{n+1}, v_{n+2}, \ldots$, do not arrive at the receiver 58 as discrete voltage levels. It is the function of the filter 64 within the adaptive equalizer 50 to remove the linear distortion, thereby restoring, at the output of the filter 64, the discrete analog voltages, $v_n, v_{n+1}, v_{n+2}, \ldots$ Filters that minimize linear distortion effects, such as those introduced by filtering in the receiver, telephone network equipment and the local loop, are known to those of skill in the art.

Although the filter is described as "restoring" the analog voltages, $v_n, v_{n+1}, v_{n+2}, \ldots$, it will be understood by those skilled in the art that equalizers, such as the adaptive equalizer 50, are typically implemented using digital signal processors rather than analog circuitry. Accordingly, the received analog voltages are typically converted to digital form within the receiver 58 before they reach the equalizer 50, and the "restored analog voltages" at the output of the filter 64 are typically actually digital numbers that represent the analog voltages, $v_n, v_{n+1}, v_{n+2}, \ldots$ For purposes of clarifying the source of the digital numbers, however, the output of the filter 64 is referred to herein as the analog voltages, $v_n, v_{n+1}, v_{n\,2}, \ldots$ Referring again to FIG. 3, the decision circuit 66 receives, as the input signal 72, the sequence of analog voltages, $v_n, v_{n+1}, v_{n+2}, \ldots$ The reference 68 preferably contains a model that includes a dictionary of all of the voltages that the digital-to-analog converter 54 might send along with their corresponding codewords. For each voltage in the sequence of analog voltages, $v_n, v_{n+1}, v_{n+2}, \ldots$, the decision circuit 66 determines which voltage the analog-to-digital converter 54 sent and provides as an output 70 the codeword associated with the determined voltage. Thus, the output 70 of the decision circuit 66 in response to the sequence of analog voltages, $v_n, v_{n+1}, v_{n+2}, \ldots$, is the encoded sequence of codewords, $c'_n, c'_{n+1}, c'_{n+2}, \ldots$ In accordance with the presently preferred embodiments, it is unnecessary that the encoder 52 and receiver 58 utilize all of the available codewords. For example, where the digital-to-analog converter 54 has the quantizing characteristic of a $\mu$-law compander, the quality of the connection may be such that the receiver 58 is unable, due to the presence of noise, intersymbol interference, and the like, to discriminate among all of the 255 possible codewords in the set. This limitation may be determined, for example, during a modem training sequence. Under these conditions, the encoder 52 may use only a subset of the available codewords, excluding those that cannot be unambiguously recovered by the receiver 58. The subset is known to both the encoder 52 and the receiver 58 after training.

It is important to note that, from the viewpoint of the equalizer 50, the digital-to-analog converter 54 is the remote transmitter, rather than the encoder 52 being the remote transmitter. Therefore, the reference 68 in the equalizer 50 is preferably a model of the digital-to-analog converter 54 voltage levels. While the reference 68 may include ideal digital-to-analog converter voltage levels, improved performance may be obtained in accordance with the preferred embodiments by utilizing a reference 68 that learns the actual, non-ideal digital-to-analog conversion characteristics of the remote transmitter, such as the digital-to-analog converter 54, that is coupled to the receiver 58.

Typical digital-to-analog converters associated with the telephone network are imperfect, i.e. their conversion characteristics vary from the ideal characteristic. For example, all output voltage levels of a digital-to-analog converter may be shifted or offset by an average amount. This type of variation from the ideal is referred to herein as "output voltage offset." The receiver 58 may correct for output voltage offset by 1) removing the offset with a highpass portion of the band limiting filter 60, or 2) shifting the voltage levels in the reference 68 by the amount of the offset.

A further example of variance from the ideal characteristic that may be found in digital-to-analog converters is gain variation. Gain variation results in digital-to-analog converter output voltages that are proportionally higher or lower in magnitude than would be the ideal voltages. The receiver 58 preferably compensates for gain variation by utilizing the automatic gain control circuit 62 and the filter 64. The automatic gain control circuit 62 may make coarse adjustments and the filter 64 may make fine adjustments in the gain.

As a still further example, a digital-to-analog converter may exhibit imperfections that cannot be classified as output voltage offset or as gain variation. Such imperfections are referred to herein as "non-linear error terms." Non-linear error terms are not corrected by the band limiting filter 60, the automatic gain control circuit 62 or the filter 64. In accordance with the preferred embodiments, the reference 68 mitigates the effects of non-linear error terms by modeling the non-linear error terms associated with the digital-to-analog converter.

Figure 4:
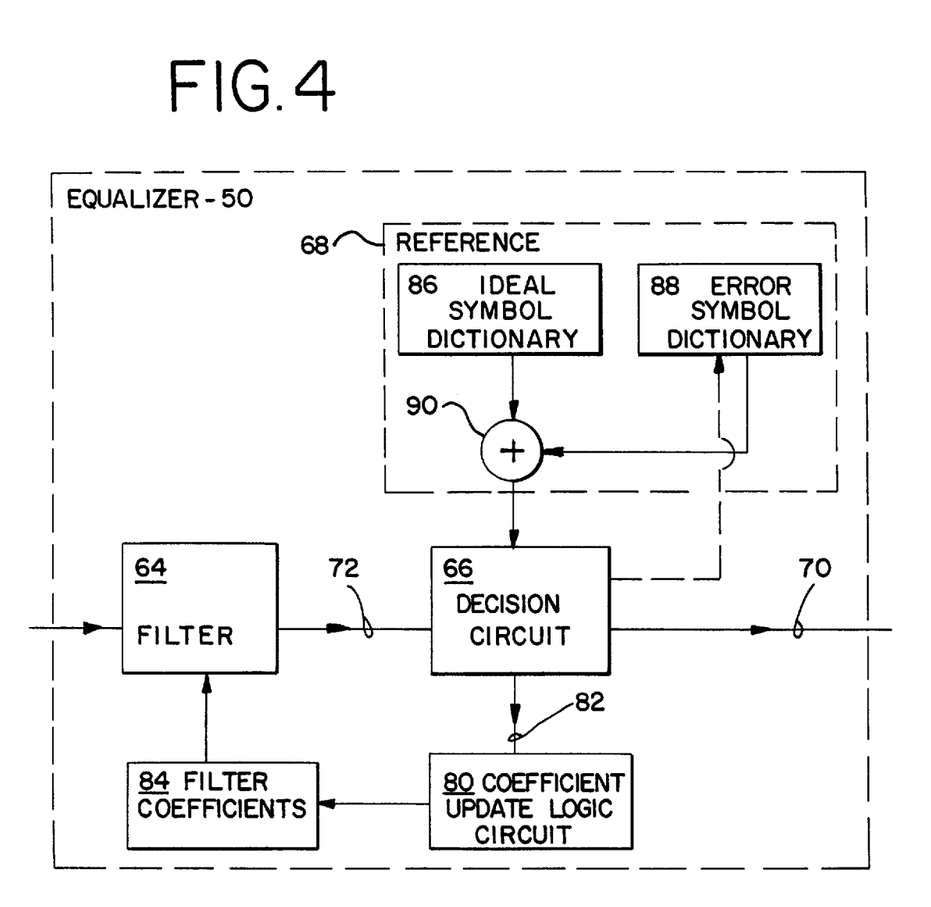
FIG. 4 is a functional block diagram of the data communication system, shown in FIG. 3, showing additional functional blocks of the adaptive equalizer.

Referring now to FIG. 4, a functional block diagram of a preferred embodiment of the adaptive equalizer 50 is presented. The equalizer 50 includes filter 64, decision circuit 66 and reference 68, as described above. In addition, a coefficient update logic circuit 80 is coupled to the decision circuit 66, which provides an equalizer error signal 82 to the coefficient update logic circuit 80. The coefficient update logic circuit 80 updates adaptive filter coefficients 84 in accordance with the equalizer error signal 82. The adaptive filter coefficients 84 may be stored within a memory device. The adaptive filter coefficients 84 are then applied to the settings of the adaptive correlation filter 64. Typically, the adaptive filter coefficients 84 are determined during a training period. The processes and devices for implementing adaptive filters, such as the adaptive filter 64, are known to those skilled in the art.

The primary function of the filter 64 is to compensate for linear distortion, such as amplitude and phase distortion, that occurs between the digital-to-analog converter 54 and the input to the filter 64. The equalizer 50 accomplishes this compensation by applying adaptive filter coefficients 84 to the filter 64, measuring how much the filter output 72 was in error (the equalizer error signal 82), and updating the filter coefficients to reduce the error. The equalizer error signal 82 is determined by comparing the filter output 72 with the symbols from the model of the remote transmitter that are provided by the reference 68.

The reference 68, as shown in FIG. 4, includes an ideal symbol dictionary 86 and an error symbol dictionary 88. The ideal symbol dictionary 86 and the error symbol dictionary 88 are joined by a combiner 90, which is coupled to the decision circuit 66. The reference 68 is shown with separate dictionaries for purposes of illustrating that the ideal symbol dictionary 86 together with the error symbol dictionary 88 preferably form the model for the remote transmitter, such as the digital-to-analog converter 54 shown in FIG. 3.

In accordance with the preferred embodiments, alternative configurations of the reference 68 may also be used as long as the reference 68 provides symbols to the decision circuit 66 that account for measurable transmitter inaccuracies. The reference 68 improves the accuracy of the decision circuit 66 by taking measured inaccuracies in the characteristic of the remote transmitter into account. In the embodiment described herein, the remote transmitter is the digital-to-analog converter 54.

The ideal symbol dictionary 86 contains or stores a representation of the symbols that would be generated if the remote transmitter had the ideal characteristic. It may contain all or some subset of the possible symbols output from the remote transmitter. In the case where the remote transmitter is a digital-to-analog converter having the quantizing characteristic of a $\mu$-law compander, the ideal symbol dictionary 86 includes representations of all or some subset of the 255 ideal output voltages for the converter. The ideal voltages may be referred to herein as the nominal voltages of the remote transmitter.

The error symbol dictionary 88 contains or stores representations of an error symbol for some or all of the symbols that are contained in the ideal symbol dictionary 86. The error symbols preferably represent quantified variation between the symbols actually transmitted by the remote transmitter and the symbols of the ideal characteristic. Preferably, each entry in the error symbol dictionary 88 is associated with one of the symbols represented in the ideal symbol dictionary 86.

It should be noted that the error symbol dictionary 88 may contain fewer symbols than the ideal symbol dictionary 86. As an example, for transmitter characteristics in which the symbols are unequally spaced, it may be desirable to correct for inaccuracies only in certain symbols that are closest to their neighbors. The symbols that are closest together may be the most susceptible to inaccurate decision due to imperfections in the remote transmitter.

The inaccuracies or imperfections in the remote transmitter may be determined as follows for the case where the remote transmitter is the digital-to-analog converter 54. The imperfect output of the digital-to-analog converter 54 corresponding to the input codeword ck may be represented as:

$$Vc_k = (1 + GERR) * \{vNOM_k + vERR_k + vOFF\}. \quad (1)$$

In equation 1, GERR is the gain error from unity, vNOMk is the nominal output voltage associated with the codeword $c_k$, $vERR_k$ is the error voltage associated with the codeword $c_k$, and vOFF is the output voltage offset of the remote transmitter. The error voltage, $vERR_k$, represents the non-linear error terms associated with the kth output level of the remote transmitter.

After $Vc_k$ is transmitted to the receiver 58, the gain variation is corrected to nominal, the output voltage offset is removed and linear distortion from the communication channel is removed, for example as described above. The remaining output of the filter 64 at time n, $v_o(n)$, will be proportional to:

$$v_o(n) = vNOM_k + vERR_k + N_o(n). \quad (2)$$

In equation 2, $N_o(n)$ represents the noise term at time n at the output of the filter 64.

Similarly, for a digital-to-analog converter 54 output $Vc_{k+1}$ corresponding to the input codeword $c_{k+1}$ where the codeword $c_{k+1}$ results in the digital-to-analog converter output voltage that is closest to the voltage $Vc_k$ of equation1, the output of the filter 64 at time n, $v_o(n)$ will be proportional to:

$$v_o(n) = vNOM_{k+1} + vERR_{k+1} + N_o(n). \quad (3)$$

The nominal voltage values preferably correspond to the values associated with the ideal characteristic of the remote transmitter, which characteristic in this example is the ideal quantizing characteristic of the digital-to-analog converter 54.

If the reference 68 contains only the ideal model, i.e. only the nominal values, then in response to an input signal 72 of $v_o$, whose value is between $vNOM_k$ and $vNOM_{k+1}$, the decision circuit 66 merely chooses from the reference 68 the nominal value that is closest to $v_o$. On the other hand, if the reference 68 also includes or accounts for the non-linear error terms, $vERR_i$, that are associated with the chosen subset of codewords, which is preferable, then a more accurate decision may be made by the decision circuit 66. In this case, the decision circuit 66 may, in response to the input signal 72 of $v_o$, select from the reference 68 the value of ($vNOM_k + vERR_k$) or ($vNOM_{k+1} + vERR_{k+1}$), whichever is closest to $v_o$. Thus, the inclusion of non-linear error terms in the reference 68 allows the decision circuit 66 to more accurately determine what the output 70 should be.

In order to construct a model in the reference 68 that accounts for inaccuracies or imperfections of the remote transmitter, the reference 68 preferably learns the non-linear error terms, $vERR_i$ associated with some or all of the output levels of the remote transmitter. These learned values may then be stored in the error symbol dictionary 88. If there are no non-linear error terms for a particular output symbol, $Vc_k$, from the remote transmitter, then the mean output of the filter 64 when such symbols are repeatedly transmitted will represent the nominal voltage. Otherwise, the mean output of the filter 64 when such symbols are repeatedly transmitted will represent the sum of the nominal voltage, $vNOM_k$, associated with the symbol and the non-linear error term, $vERR_k$, associated with the symbol, $Vc_k$. The equalizer 50 may measure the non-linear error term, vERR, associated with some or all of the output levels of the remote transmitter in several ways.

Figure 5:
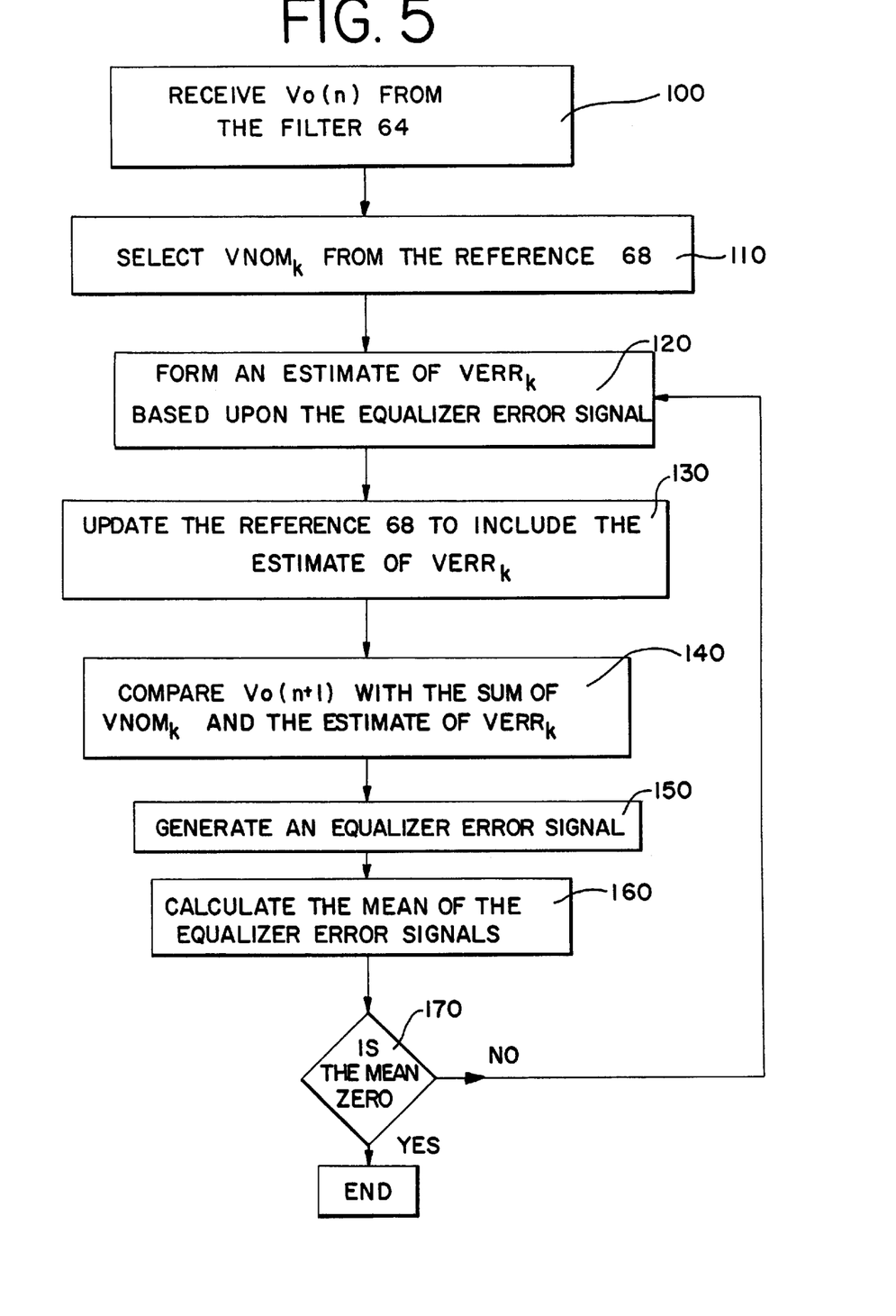
FIG. 5 is a flow chart illustrating a first mode of operation of the adaptive equalizer shown in FIG. 4 to measure a non-linear error term.

FIG. 5 is a flow chart illustrating a first mode of operation of the adaptive equalizer 50, shown in FIG. 4, to measure a non-linear error term associated with the kth output level of the remote transmitter. The first mode utilizes a feedback method of measuring the non-linear error term, $vERR_k$. The remote transmitter generates a known output voltage $Vc_k$ that is repeatedly sent to the receiver 58, where an input signal 72 $v_o$ is repeatedly produced at step 100. The decision circuit 66 then selects, at step 110, from the ideal symbol dictionary 86, the value $vNOM_k$ for comparison to a first input signal, $v_o(1)$. Next, at step 120, an estimate of the non-linear error term, $vERR_k$, is measured from the equalizer error signal 82 resulting from the comparison of the first input signal $v_o(1)$ with $vNOM_k$. At step 130, the reference 68 is updated to include the estimate of $vERR_k$. Step 130 may include storing the estimate of $vERR_k$ in the error symbol dictionary 88. Next, at step 140, the decision circuit 66 compares a second input signal $v_o(2)$ with the sum of $vNOM_k$ and the estimate of $vERR_k$. At step 150 of the first mode of operation, the decision circuit 66 generates an equalizer error signal based upon the comparison at step 140. Next, the mean of the equalizer error signal is calculated at step 160. At step 170, a decision is made. If the mean calculated at step 160 is zero, then the adaptation of the reference 68 ends, and the current estimate of $vERR_k$ is stored in the error symbol dictionary 88. If, however, the mean calculated at step 160 is not zero, then the operation loops back to step 120.

In accordance with a preferred embodiment of the present invention, the initial estimate of the non-linear error term, $vERR_k$, may correspond to the value of the equalizer error signal 82. A fraction of the equalizer error signal 82 may alternatively be used. For subsequent updates of the initial estimate, all or some fraction of the subsequent value of the equalizer error signal 82 may be added to the initial estimate. Preferably, however, the non-linear error term is updated by making small adjustments to its value, for example one one-hundredth of the value of the equalizer error signal 82.

A second mode of operation of the adaptive equalizer 50 shown in FIG. 4 may alternatively be used to measure a non-linear error term. In accordance with the second mode, a direct measure is made of the non-linear error term. As in the first mode, the remote transmitter generates a known output voltage, $Vc_k$, that is repeatedly sent to the receiver 58, where an input signal 72, $v_o(n)$, is repeatedly produced. The decision circuit 66 compares the successive values of $v_o$ with an ideal value, $vNOM_k$, from the reference 68. The equalizer error signal 82 is then averaged during the successive events, providing an estimate of the value of $vERR_k$. This estimate may be made arbitrarily accurate depending upon the length of time over which the equalizer error signal 82 is averaged. The estimate of the value of $vERR_k$ is then stored in the reference 68 in association with the value $vNOM_k$.

As noted above, the encoder 52 may use only a subset of the available codewords, which subset is known to both the encoder 52 and the receiver 58 after training. It is envisioned that the equalizer 50 may participate in the selection of the subset of codewords. For example, a codeword, $c_j$, may be excluded from the subset if the characteristic output, $Vc_j$, of the remote transmitter corresponding to that particular codeword, $c_j$, results in a $vERR_j$, entry in the error symbol dictionary 88 that exceeds a threshold. The threshold may be predetermined or may be adapted depending, for example, upon the number of codewords meeting the threshold.

In accordance with a preferred embodiment of the present invention, the non-linear error terms are measured, for example in one of the modes described above, for some of all of the output levels of the remote transmitter. In this manner, a model may be constructed in the reference 68 that accounts for imperfections in the remote transmitter. The equalizer 50 may then utilize the reference 68 during data transmission to improve the accuracy of decisions on what the output signal 70 should be. In particular, the equalizer 50 advantageously mitigates the effects of non-linear distortion in the data signal received from remote transmitter.

It is intended that the foregoing detailed description be regarded as illustrative rather than limiting and that it is to be understood that the following claims, including all equivalents, define the scope of the invention.

We claim:

1. An equalizer, comprising:
   a filter having an output;
   a decision circuit coupled to said filter output; and
   a reference coupled to said decision circuit, wherein said reference comprises a model of a non-linear characteristic of a remote transmitter, said decision circuit compares a signal from said filter output with a signal from said reference, and said signal from said reference consists of an ideal symbol modified by a corresponding non-linear error symbol.

2. An equalizer as claimed in claim 1, wherein said model comprises a first plurality of ideal symbols and a second plurality of error symbols.

3. An equalizer as claimed in claim 2, wherein said first plurality of ideal symbols are associated with a quantization characteristic of said remote transmitter.

4. An equalizer as claimed in claim 3, wherein said second plurality of error symbols are associated with non-linear inaccuracies in at least a portion of said quantization characteristic of said remote transmitter.

5. An equalizer as claimed in claim 1, wherein said reference is an adaptive reference that is adapted in accordance with a fixed imperfection within said remote transmitter.

6. An equalizer as claimed in claim 5, wherein said fixed imperfection is associated with a telephone network codec that drives a loop circuit coupled between said remote transmitter and said filter.

7. An equalizer as claimed in claim 6, wherein said fixed imperfection is associated with a mapping rule implemented by said codec.

8. An equalizer as claimed in claim 7, wherein said codec comprises a digital-to-analog converter that is coupled to said loop circuit and said fixed imperfection is associated with a digital-to-analog conversion at said digital-to-analog converter.

9. In a receiver that is coupled by an analog line to a digital telephone network, which network interfaces to said analog line through a digital-to-analog converter that converts a digital codeword from the network into one of a plurality of output symbols, an adaptive equalizer, comprising:
   a correlation filter;
   a decision circuit coupled to said correlation filter; and
   an adaptive reference coupled to said decision circuit, wherein said adaptive reference comprises a first dictionary of symbols and an adaptive second dictionary of inaccuracies associated with said digital-to-analog converter.

10. An adaptive equalizer as claimed in claim 9, wherein said symbols in said first dictionary of symbols correspond to ideal representations of said digital-to-analog converter output symbols.

11. An adaptive equalizer as claimed in claim 9, wherein said decision circuit compares a correlation filter output signal with a signal from said adaptive reference.

12. An adaptive equalizer as claimed in claim 11, wherein said decision circuit provides an output signal corresponding to an adaptive reference signal that is closest to said correlation filter output signal.

13. An adaptive equalizer as claimed in claim 9, further comprising an adaptive coefficient update circuit coupled between said decision circuit and said correlation filter.

14. A method of adaptively equalizing a signal received from a remote transmitter, comprising the steps of:

receiving a signal corresponding to a predetermined reference level from the remote transmitter;

filtering the received signal level to remove linear error terms; and measuring a non-linear error term associated with the received and filtered signal wherein said measuring step comprises:

generating an equalizer error signal from said filtered signal by a comparison of said filtered signal to an estimate signal that is uniquely associated with said predetermined reference level; and updating said estimate signal by adding at least a fraction of said equalizer error signal to said estimate signal.

15. A method as claimed in claim 14, further comprising the step of replacing said estimate signal with the sum of said estimate signal and said fraction of said equalizer error signal.

16. A method as claimed in claim 15, further comprising the step of repeating the measuring steps of claim 14 until the equalizer error signal has a zero mean.

17. A method as claimed in claim 14, wherein said measuring step comprises:

averaging an equalizer error signal over a period of time, wherein said equalizer error signal is generated by comparing said filtered signal to an estimate; and then combining said estimate with said average error signal to form an updated estimate.

18. A method as claimed in claim 14, wherein said remote transmitter utilizes a plurality of reference levels to transmit data and said plurality of reference levels are associated with a claw quantization rule.

19. A method as claimed in claim 18, wherein said measuring step comprises comparing the filtered signal with an estimate signal selected from a plurality of estimate signals.

20. A method as claimed in claim 19, wherein each of said plurality of estimate signals corresponds to an ideal representation of a reference level from said plurality of reference levels.

21. A method of adaptively equalizing a signal that is transmitted to a receiver from a remote transmitter over a subscriber loop, comprising the steps of:

receiving a training signal transmitted by the remote transmitter, wherein said training signal comprises a predetermined repetitive sequence of analog voltages;

constructing a reference of the remote transmitter from said training signal, said reference including a dictionary of non-linear error terms;

receiving a data signal transmitted by the remote transmitter; and recovering data from the data signal by using said reference to equalize said data signal.

22. A method as claimed in claim 21, wherein said predetermined repetitive sequence of analog voltages comprises a first sequence of analog voltages at a level corresponding to a first output level of the remote transmitter.

23. A method as claimed in claim 22, wherein said predetermined repetitive sequence of analog voltages further comprises a second sequence of analog voltages at a level corresponding to a second output level of the remote transmitter.

24. A method as claimed in claim 21, wherein said step of constructing said reference comprises the step of updating said reference to include said dictionary of non-linear error terms and a dictionary of nominal values associated with the remote transmitter.

* * * * *